US008289720B2

(12) United States Patent
Ishikawa (10) Patent No.: US 8,289,720 B2
(45) Date of Patent: Oct. 16, 2012

(54) ELECTRONIC APPARATUS

(75) Inventor: Koji Ishikawa, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 450 days.

(21) Appl. No.: 12/699,716

(22) Filed: Feb. 3, 2010

(65) Prior Publication Data

US 2010/0195303 A1    Aug. 5, 2010

(30) Foreign Application Priority Data

Feb. 4, 2009    (JP) .................................. 2009-023967

(51) Int. Cl.
*H05K 1/00*    (2006.01)
(52) U.S. Cl. ........ 361/749; 361/752; 361/807; 361/810; 174/254
(58) Field of Classification Search .......... 361/749–752, 361/807–810; 174/254
See application file for complete search history.

(56) References Cited

U.S. PATENT DOCUMENTS

| | | | | |
|---|---|---|---|---|
| 6,118,666 A | * | 9/2000 | Aoki et al. | 361/749 |
| 7,177,161 B2 | * | 2/2007 | Shima | 361/816 |
| 7,423,690 B2 | * | 9/2008 | Lee et al. | 348/374 |
| 2005/0179813 A1 | * | 8/2005 | Fujii et al. | 348/375 |

FOREIGN PATENT DOCUMENTS

JP    2007-166290    6/2007

* cited by examiner

*Primary Examiner* — Tuan T Dinh
(74) *Attorney, Agent, or Firm* — Canon USA Inc IP Division

(57) ABSTRACT

An electronic apparatus includes an outer cover member, an internal structure member, first and second external connection connectors, and first and second printed circuit boards. The first printed circuit board has a first surface on which the first external connector is mounted thereon, a signal pattern of the first external connector is formed on the first surface, and a second surface. The second printed circuit board has a first surface on which the second external connector is mounted thereon, a signal pattern of the second external connector is formed on the first surface, and a second surface. Ground patterns are formed on the second surfaces of the printed circuit boards. The first and second external connectors overlap and are arranged in a space surrounded by the outer cover member and the internal structure member so that the second surfaces of the first and second printed circuit boards face each other.

6 Claims, 13 Drawing Sheets

ELECTRONIC APPARATUS

BACKGROUND OF THE INVENTION

1. Field of the Invention

The present invention relates to an electronic apparatus, especially to an electronic apparatus including a plurality of external connection connectors.

2. Description of the Related Art

While electronic apparatuses are desired to have higher performances and more functions, external interfaces connecting an electronic apparatus to an external apparatus diversify, so that electronic apparatuses are required to be compatible with many types of external interface specifications. At the same time, as electronic apparatuses evolve, specifications of external interfaces become more speedy and more functional, so that electronic apparatuses are required to be compatible with interfaces of many signal pins and a differential signaling method.

Therefore, not only a plurality of external interface connectors need to be mounted on an electronic apparatus, but also connecters with many pins need to be mounted to transmit/receive many signals on a per-connector basis, so that a necessary space to mount these connecters increases.

To transmit external connection signals by the differential signaling method, an impedance control of internal wiring pattern is required according to the differential signaling specification. Therefore, the wiring pattern of a differential signal from a driver IC to an external connection connector needs to be formed so that a desired differential impedance is obtained.

Therefore, conventionally, as a configuration which can easily eliminate causes of impedance disruption such as a wiring connection between boards via connectors, and easily control the impedance, the driver IC and external connection terminals are arranged on the same board. However, as downsizing and thinning of electronic apparatuses progress, when all the external connection connectors are arranged on a main board, an area and thickness of the main board need to increase, so that the main board becomes an obstacle to downsizing a camera.

As an electronic apparatus which can connect to a plurality of external interfaces, Japanese Patent Application Laid-Open No. 2007-166290 discusses an electronic apparatus in which a separate board on which a plurality of external connection connectors are mounted is connected to the main board by using a flexible printed circuit board.

However, in the conventional arrangement configuration of the external connection connectors, since the external connection connectors are aligned and arranged on the separate board, a space to align the connecters is needed, so that there is a problem that the conventional arrangement configuration is not suited for downsizing of the apparatus.

Further, although a connecting wiring from the external connection connector to the main board needs a width large enough for a plurality of interface signals, the space for the wiring cannot be obtained when the apparatus is downsized. When there is no space for the wiring, the wiring for the connection is formed by a multilayer board or a plurality of connection boards; however, the multilayer board is expensive. On the other hand, when the external connection connector includes a plurality of differential signals, wiring which controls impedance is generally formed on the surface layer. Therefore, when the width of the board is not large enough for the wiring, the wiring is formed on both surfaces of the board.

However, when the pattern is connected from the surface on which the connector is mounted, to the reverse surface of the board, the pattern is connected through a through-hole, so that the impedance is disrupted. Further, when connecting the pattern by piling up a plurality of connection boards, there is a problem that the impedance-controlled wiring pattern is affected by a wiring pattern of another connection board, and the impedance is disrupted.

SUMMARY OF THE INVENTION

According to an aspect of the present invention, an electronic apparatus includes an outer cover member, an internal structure member covered by the outer cover member, a first external connection connector connectable to an external apparatus, a first printed circuit board having a first surface on which the first external connection connector is mounted thereon, a signal pattern of the first external connection connector is formed on the first surface, and a second surface that is a reverse surface of the first surface, the second surface having a ground pattern formed thereon, a second external connection connector connectable to an external apparatus and a second printed circuit board having a first surface on which the second external connection connector is mounted thereon, a signal pattern of the second external connection connector is formed on the first surface of the second printed circuit board, and a second surface that is a reverse surface of the first surface of the second printed circuit board, the second surface of the second printed circuit board having a ground pattern formed thereon, wherein the first external connection connector and the second external connection connector overlap with each other and are arranged in a space surrounded by the outer cover member and the internal structure member so that the second surface of the first printed circuit board and the second surface of the second printed circuit board face each other.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

Figure 1:
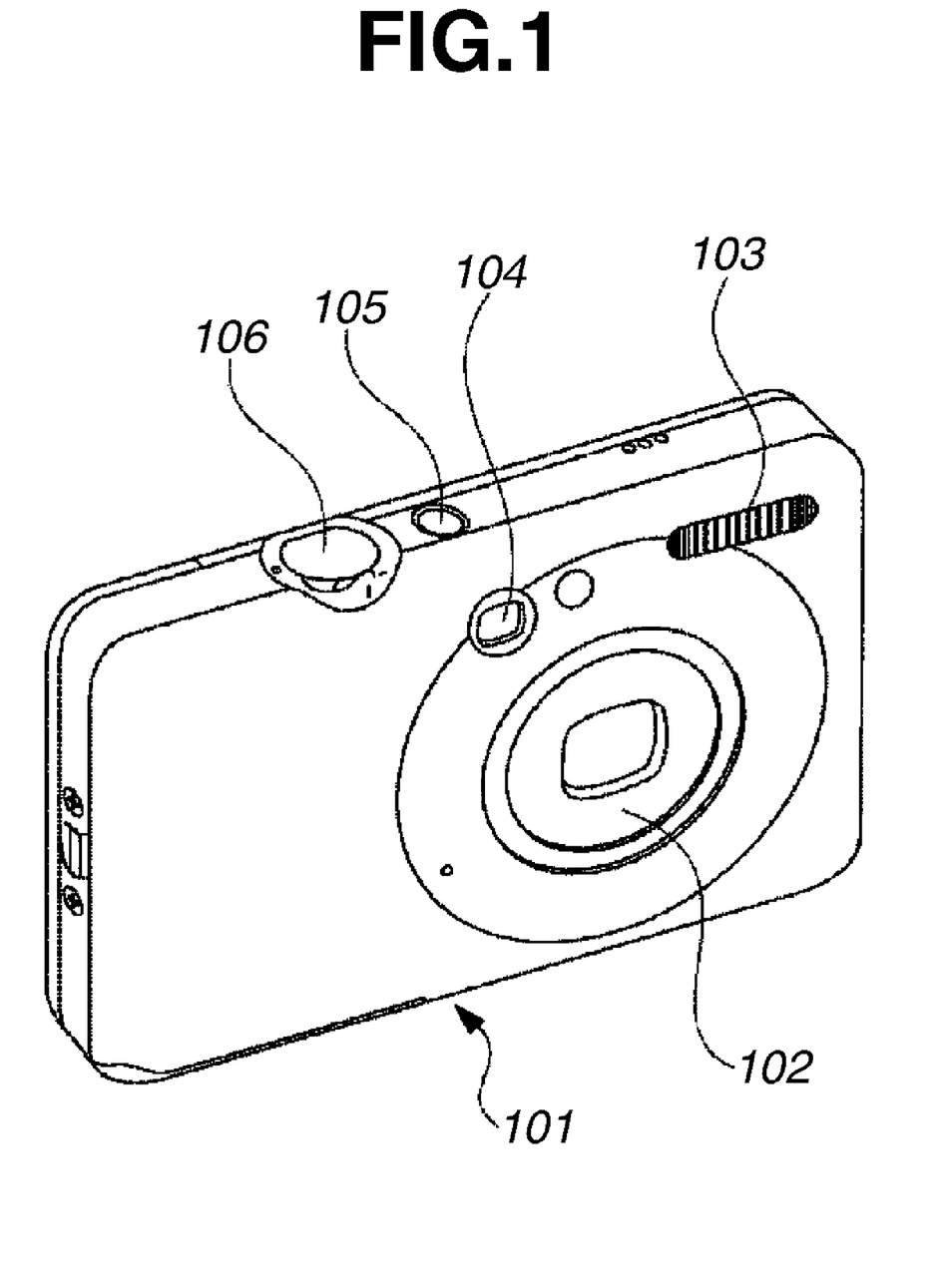
FIG. 1 is an external view of an image capture apparatus (digital camera) of an exemplary embodiment of the present invention as viewed from the front.
Figure 2:
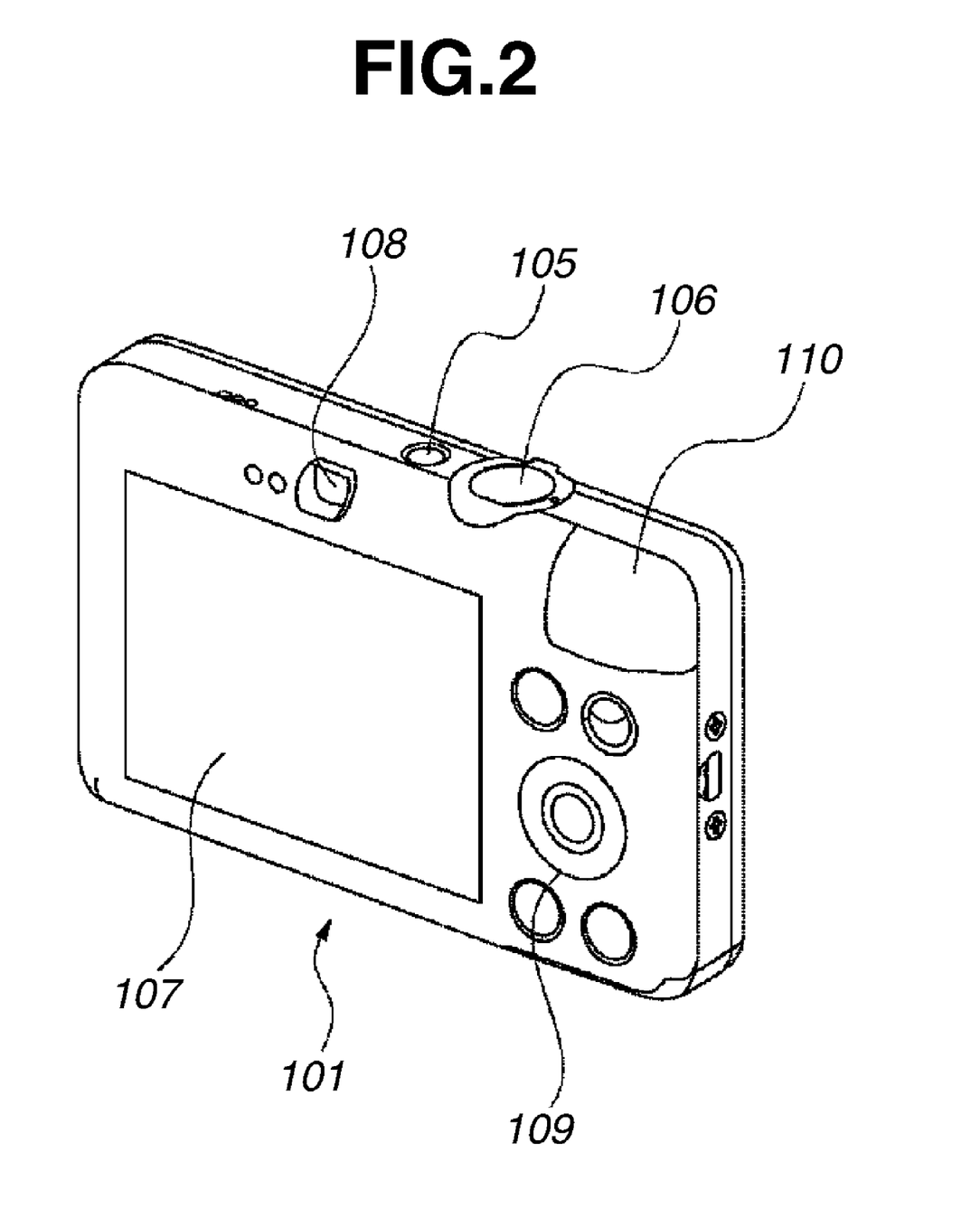
FIG. 2 is an external view of the image capture apparatus (digital camera) as viewed from the rear.
Figure 3:
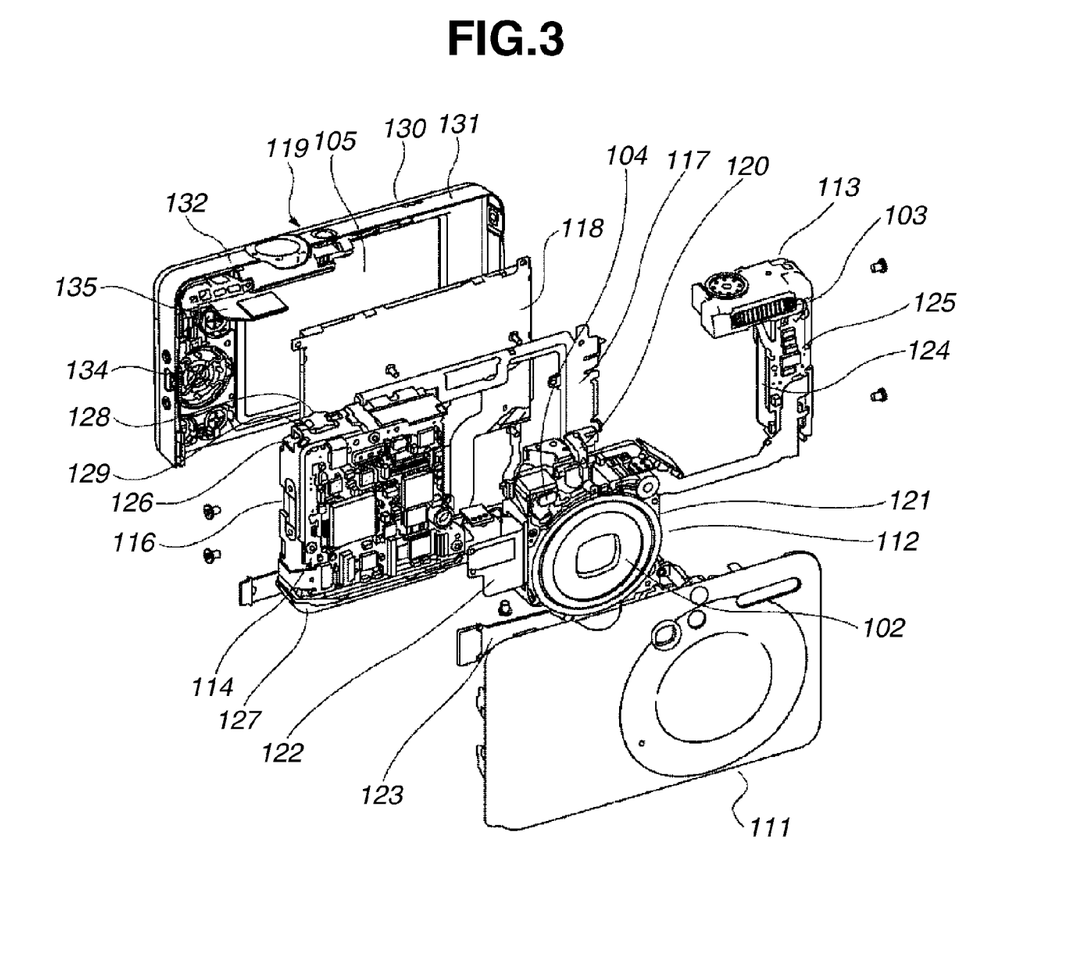
FIG. 3 is an exploded perspective view illustrating an internal configuration of the image capture apparatus.
Figure 4:
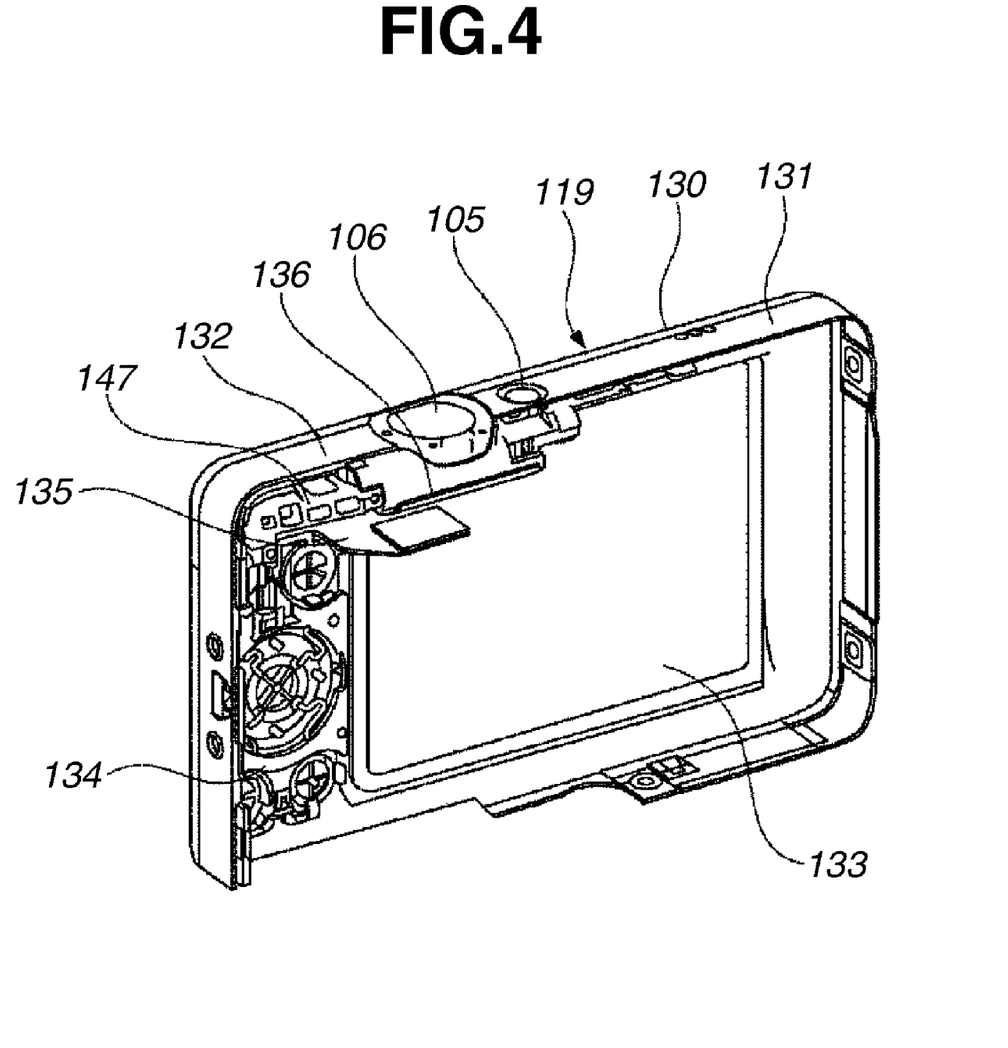
FIG. 4 is an external view of a rear cover unit.
Figure 5:
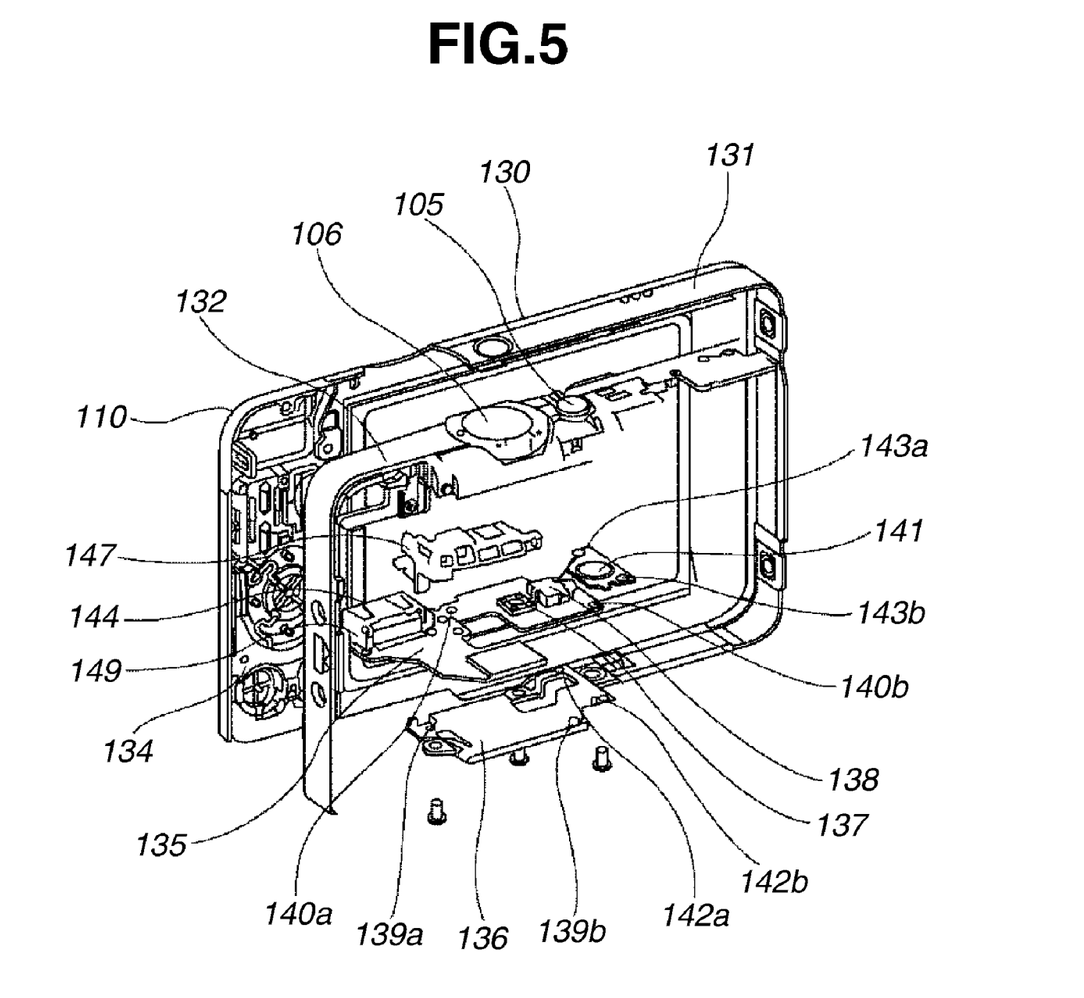
FIG. 5 is an exploded perspective view illustrating a configuration of the rear cover unit.
Figure 6:
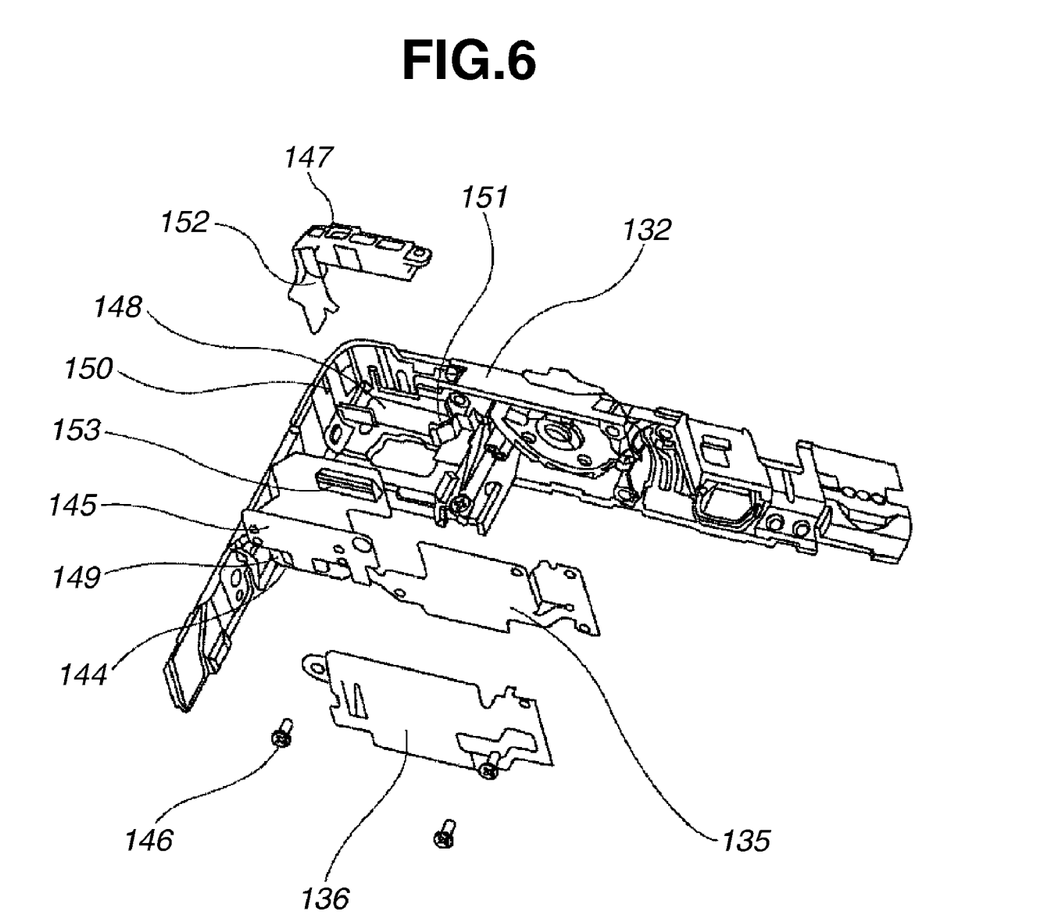
FIG. 6 is an exploded perspective view illustrating a configuration of a top cover unit.
Figure 7A:
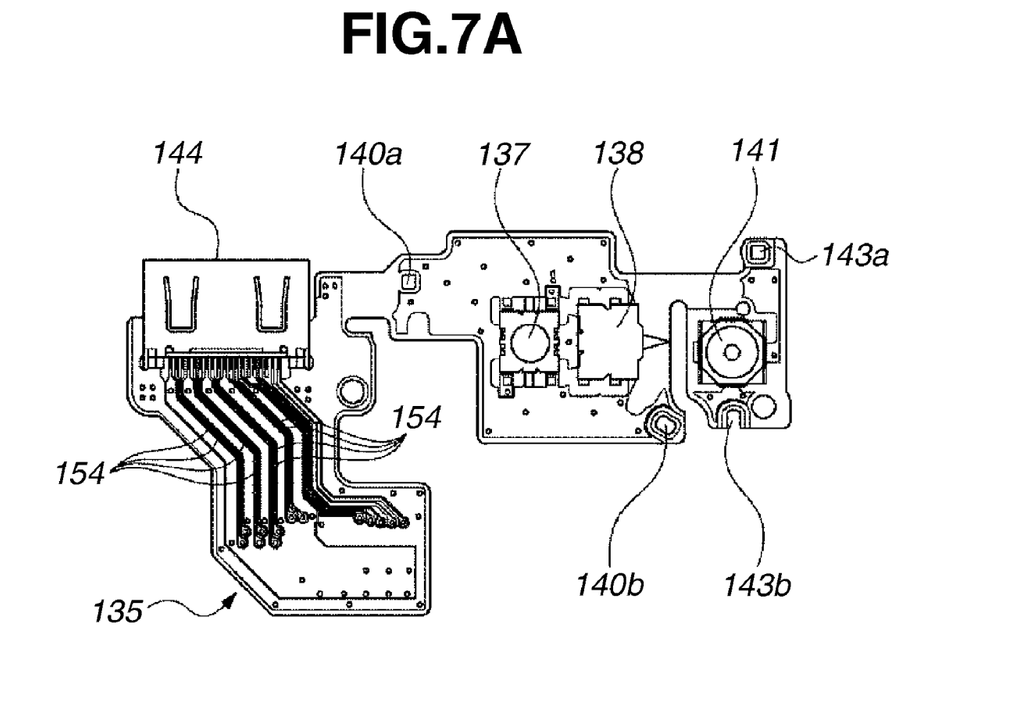
FIGS. 7A and 7B are views illustrating wiring states of a flexible printed circuit board (top FPC) on which a high-definition multimedia interface (HDMI) connector is mounted.
Figure 7B:
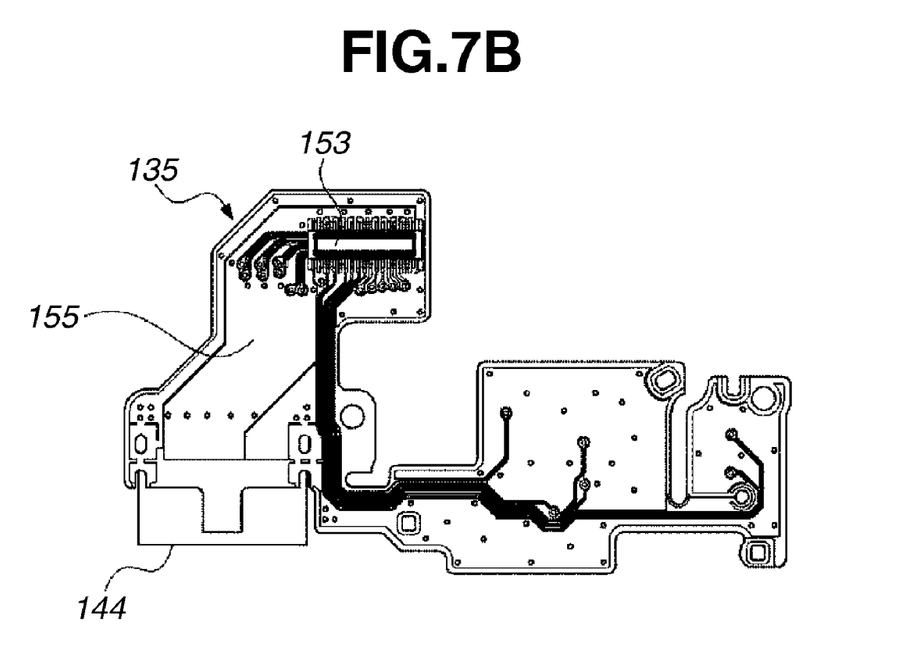
Figure 8:
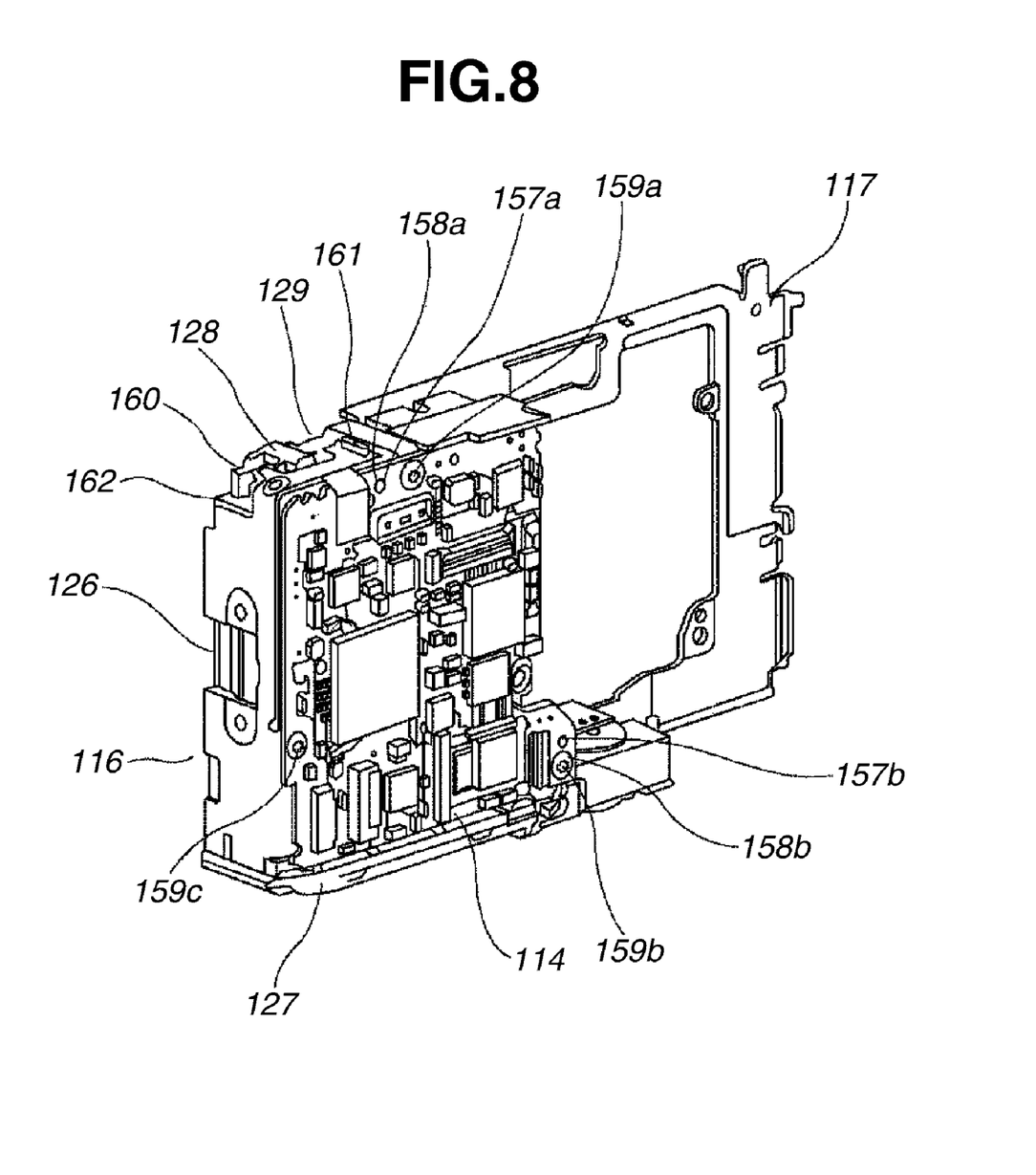
FIG. 8 is an external view illustrating a state in which a main board and a flexible printed circuit board (jack FPC) on which a universal serial bus/audio and visual (USB/AV) combination connector is mounted are attached to a battery box unit.
Figure 9:
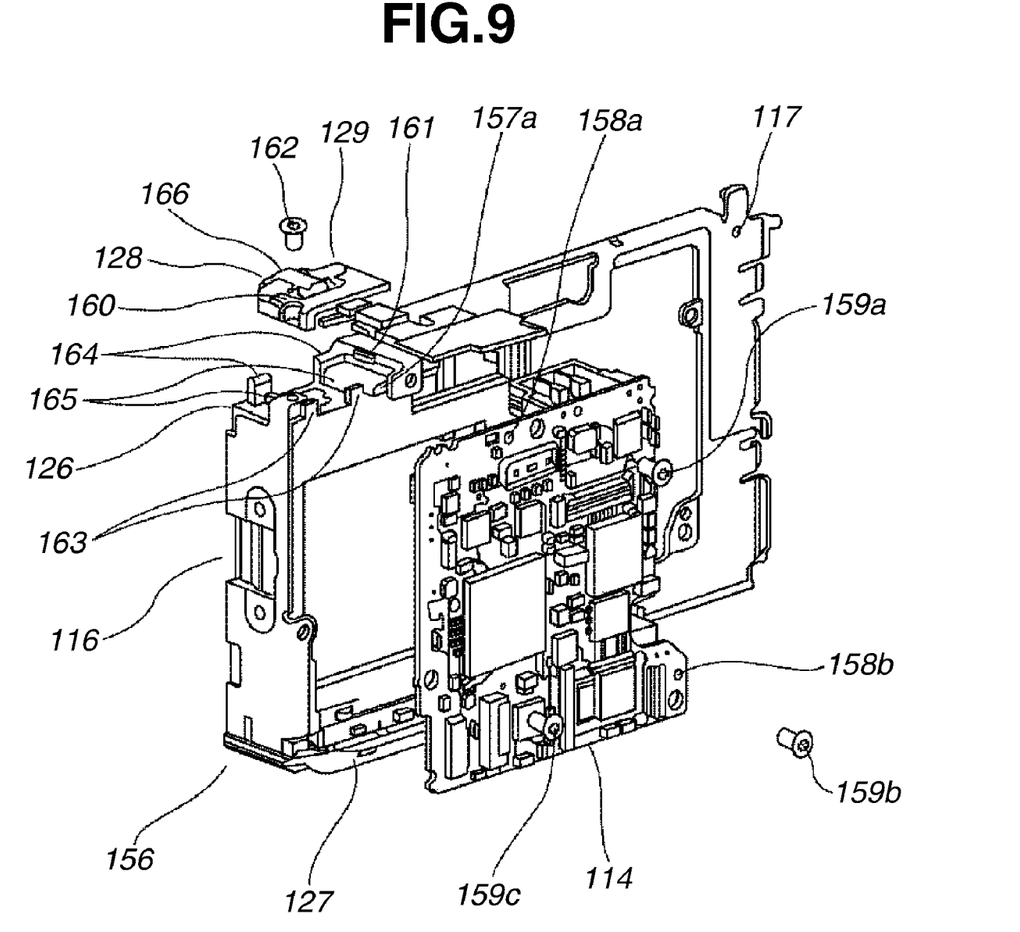
FIG. 9 is an exploded perspective view of the battery box unit, the main board, and the jack FPC.
Figure 10A:
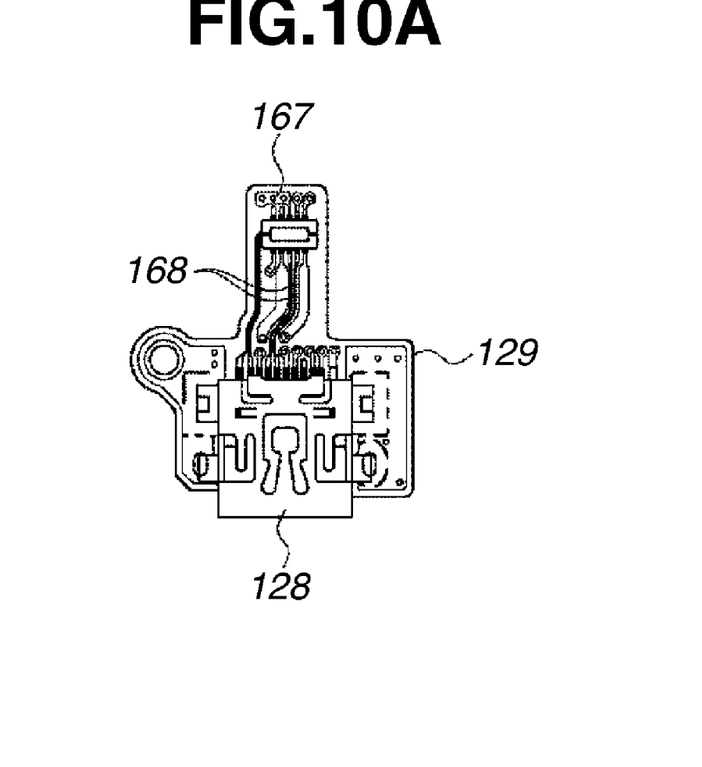
FIGS. 10A and 10B are views illustrating wiring states of the jack FPC.
Figure 10B:
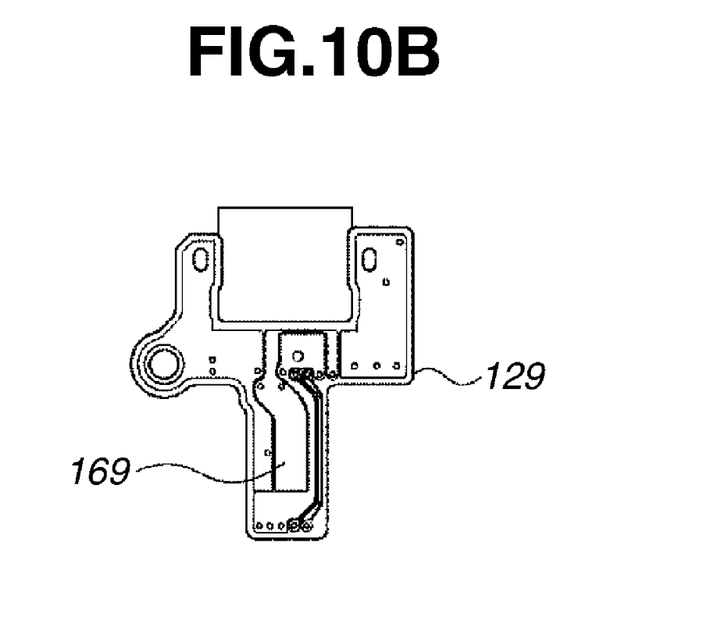
Figure 11:
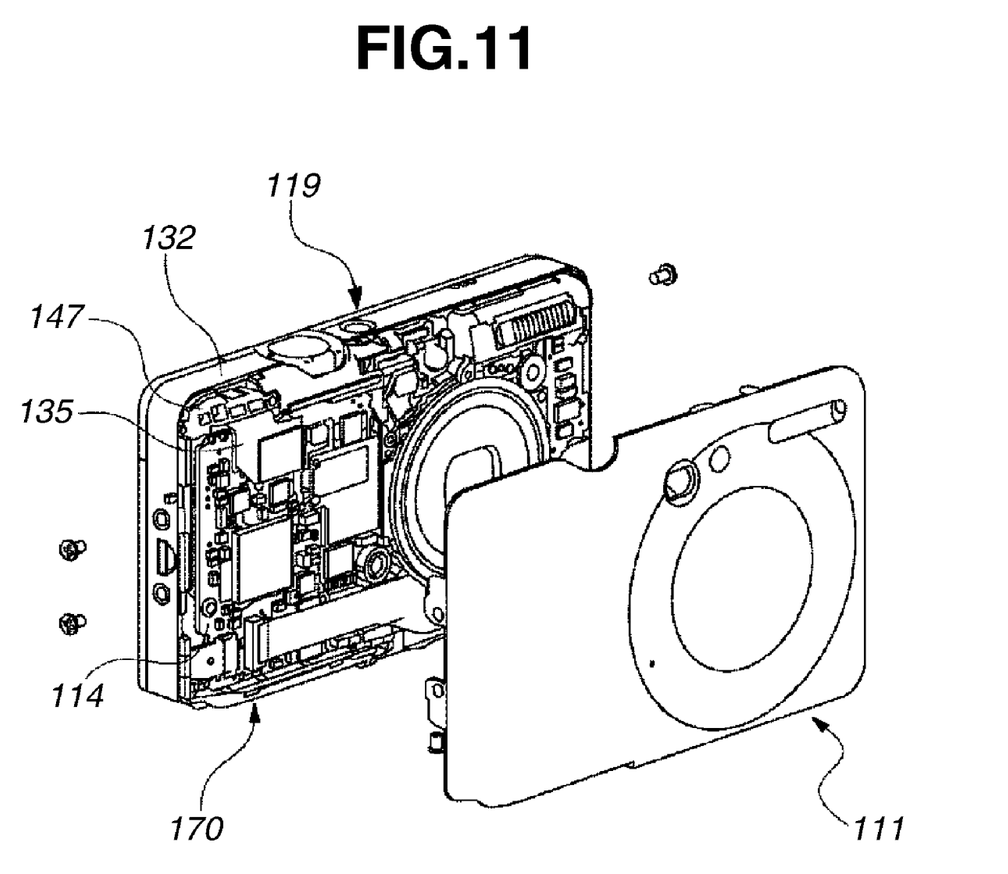
FIG. 11 is an exploded perspective view illustrating a state of the main assembly unit after the rear cover is attached.
Figure 12:
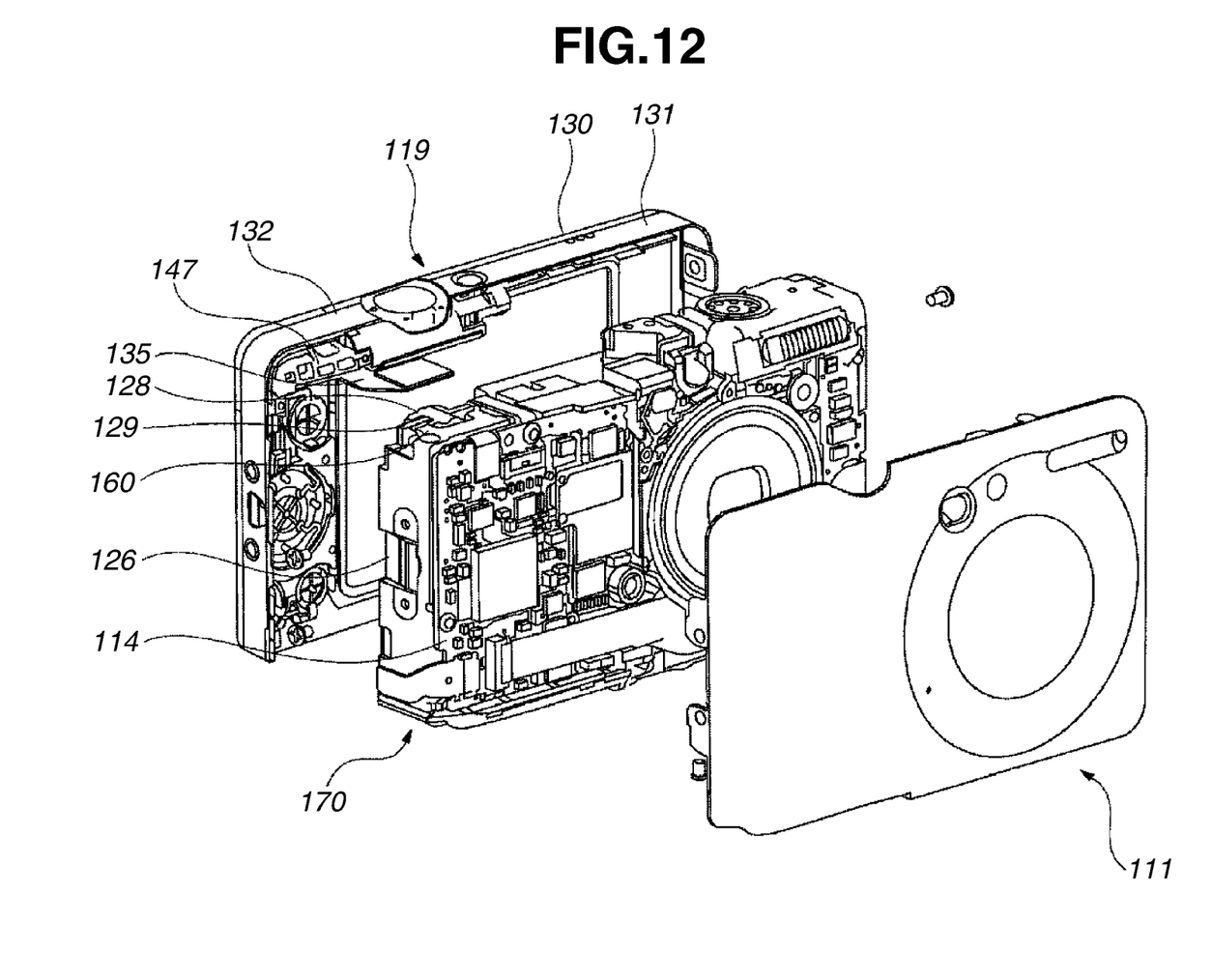
FIG. 12 is an exploded perspective view illustrating a state of a main assembly unit before the covers are attached.
Figure 13:
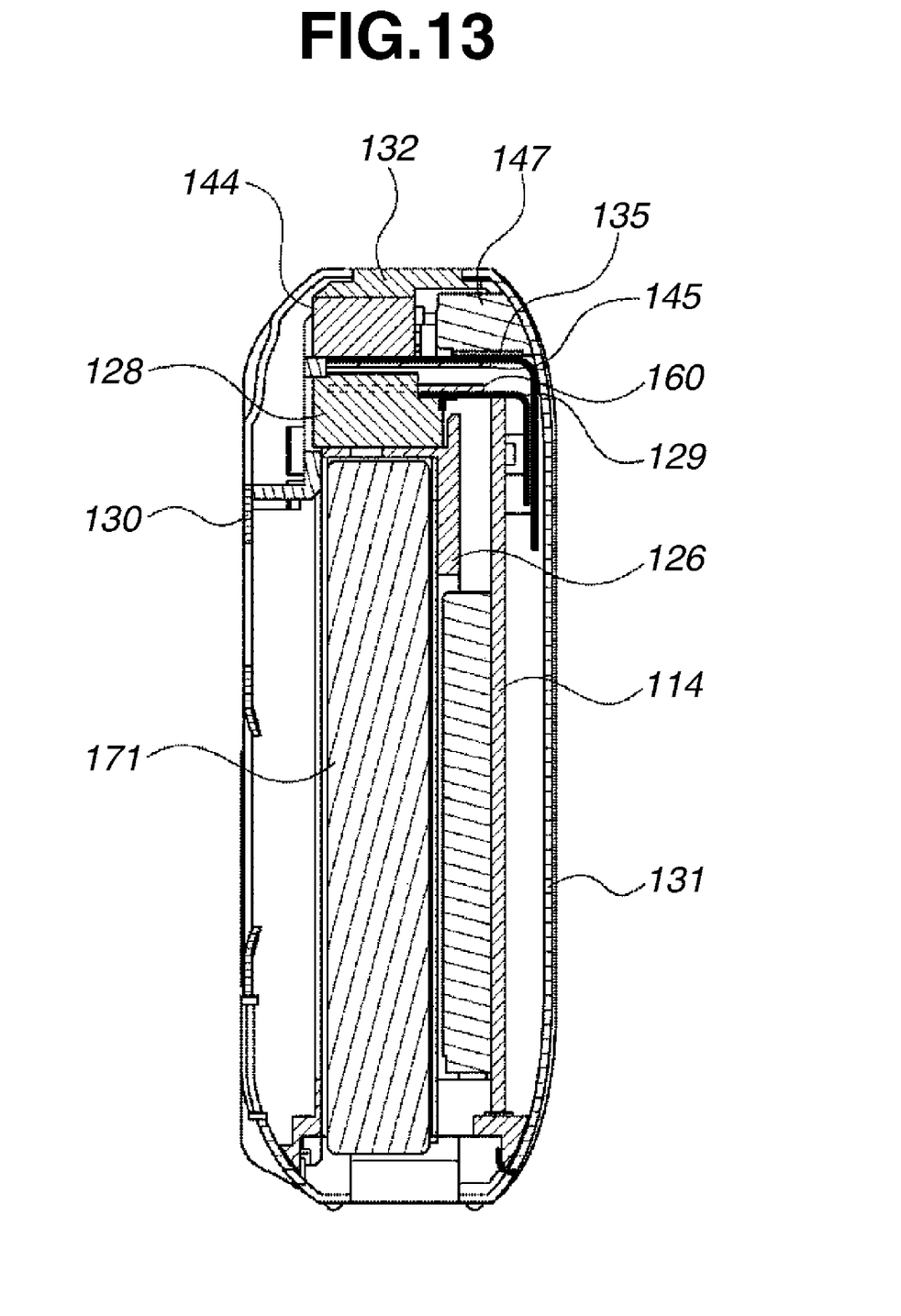
FIG. 13 is a cross-sectional view illustrating an internal configuration of a portion in which the HDMI connector and the USB/AV combination connector are arranged in a digital camera.

FIG. 1 is an external view of a digital camera which is an electronic apparatus according to an exemplary embodiment of the present invention as viewed from the front. FIG. 2 is an external view of the digital camera which is the electronic apparatus according to the exemplary embodiment of the present invention as viewed from the rear. FIG. 3 is an exploded perspective view illustrating an internal structure of the electronic apparatus according to the exemplary embodiment of the present invention. FIG. 4 is an external view of a rear cover unit. FIG. 5 is an exploded perspective view illustrating a configuration of the rear cover unit. FIG. 6 is an exploded perspective view illustrating a configuration of a top cover unit. FIGS. 7A and 7B are views illustrating wiring states of a flexible printed circuit board (top FPC) on which an HDMI connector is mounted. FIG. 7A is a view illustrating a surface on which the HDMI connector is mounted and FIG. 7B is a view illustrating the reverse surface of the top FPC. FIG. 8 is an external view illustrating a state in which a main board and a flexible printed circuit board (jack FPC) on which a USB/AV combination connector is mounted are attached to a battery box unit. FIG. 9 is an exploded perspective view of the battery box unit, the main board, and the jack FPC. FIGS. 10A and 10B are views illustrating wiring states of the jack FPC. FIG. 10A is a view illustrating a surface on which the USB/AV combination connector is mounted and FIG. 10B is a view illustrating the reverse surface of the jack FPC. FIG. 11 is an exploded perspective view illustrating a state of the main assembly unit after the rear cover is attached. FIG. 12 is an exploded perspective view illustrating a state of a main assembly unit before the covers are attached. FIG. 13 is a cross-sectional view illustrating an internal configuration of a portion in which the HDMI connector and the USB/AV combination connector are arranged in a digital camera.

Hereinafter, the digital camera which is the electronic apparatus according to the exemplary embodiment of the present invention will be described with reference to the drawings.

In FIG. 1, an photographic lens unit 102, a strobe flash unit 103, and an object-side finder unit 104 are arranged in a digital camera 101 so that these units are exposed from an opening provided in a front cover of the digital camera. On the top surface of the camera, a power button 105 for turning on/off the power of the camera and a release button 106 for performing image capturing are arranged. As illustrated in FIG. 2, on the rear surface of the camera, a liquid crystal display unit 107, an eye-side finder unit 108, an operation button unit 109 for performing various camera operations, and a jack cover 110 covering the HDMI connector and the USB/AV combination connector are arranged. The USB/AV combination connector is a connector which can be connected to two types of connectors, i.e., a USB connector and a connector outputting an audio-visual signal.

FIG. 3 illustrates an internal structure of the digital camera 101. The digital camera 101 includes a front cover unit 111, a lens barrel unit 112, a strobe unit 113, a main board 114, a battery box unit 116, a main chassis 117, a liquid crystal unit 118, and a rear cover unit 119.

The front cover unit 111 is an outer cover member covering the front of the camera. The front cover unit 111 has an opening from which the photographic lens unit 102 of the lens barrel unit 112, the strobe flash unit 103 of the strobe unit 113, the object-side finder unit 104 of a finder unit 120 of the lens barrel unit 112 are exposed.

The lens barrel unit 112 includes a photographic lens barrel unit 121 and the finder unit 120. The photographic lens barrel unit 121 includes a photographic lens, a lens driving unit for performing zooming and focusing operations of the photographic lens, and a photoelectric conversion element for converting a subject image formed by the photographic lens into an electric signal. The photoelectric conversion element is mounted on a flexible printed circuit board (image sensor FPC) 122 on which a connection connector connected to the main board 114 is mounted. The photoelectric conversion element is electrically connected by the image sensor FPC to the main board 114 on which a circuit for performing driving and signal processing of the photoelectric conversion element is mounted. The lens driving unit includes a flexible printed circuit (lens barrel FPC) 123 on which a connector for connecting a motor included in the lens driving unit and a sensor for detecting a lens position with the main board 114 is mounted. The lens barrel FPC 123 is electrically connected to the main board 114 by the connection connector which is mounted on the lens barrel FPC 123 to connect to the main board 114.

The strobe unit 113 includes a strobe flash unit 103, a main capacitor 124 for strobe flash, and a flexible printed circuit board (strobe FPC) 125 on which a circuit for strobe flash is mounted. The strobe FPC 125 is connected to the main board 114 by a connector which is mounted on the strobe FPC 125 to connect to the main board 114.

The battery box unit 116 includes a battery box 126 (internal structure member) forming a battery storage chamber and a battery cover 127 provided in the battery box 126 to cover an opening provided for inserting/removing battery. The battery box unit 116 is attached and fixed to the main chassis 117, and the main board 114 and a jack FPC 129 (second printed circuit) are attached to the battery box unit 116. A USB/AV combination connector 128 (second external connection connector) and a connector to connect to the main board 114 (circuit board) are mounted on the jack FPC 129.

A protrusion, hole, screw hole, hook, and the like for positioning are provided in the main chassis 117 at predetermined positions so that each unit can be positioned and fixed.

The liquid crystal unit 118 includes a liquid crystal panel and a backlight, which are connected to the main board 114 by flexible printed circuit boards, respectively.

The rear cover unit 119 is an outer cover member covering the rear of the camera. The rear cover unit 119 includes a rear cover 130, a center cover 131, and a top cover 132. In the rear cover 130, a transparent protective panel 133 is attached to an opening formed in a manner that the display unit of the liquid crystal panel can be exposed. In the rear cover 130, a key top part 134 of the operation button is attached to the operation button unit 109. On the other hand, in the top cover 132, the power button 105 and the release button 106 are arranged, and a top FPC 135 (first printed board) is attached. An HDMI connector 144 (first external connection connector) and a connector to connect to the main board 114 (circuit board) are mounted on the top FPC 135.

Next, a configuration of a portion for attaching the top FPC 135 to the rear cover unit 119, and a portion for attaching the main board 114 and the jack FPC 129 to the battery box unit 116 will be described in more detail.

First, a configuration of a portion for attaching the top FPC 135 to the rear cover unit 119 will be described with reference to FIGS. 4 to 6.

As illustrated in FIG. 4, from the rear cover unit 119, a connector mounting portion of the top FPC 135 for connecting to the main board 114 is formed in an arm shape extended from the rear cover unit 119. In the connector mounting portion, a reinforcing plate is attached to the reverse surface of the connector mounting portion. To attach the top FPC 135 to the rear cover unit 119, as illustrated in FIG. 5, a top plate 136 to which the top FPC 135 is positioned and temporarily fixed is fixed by screw cramp to the top cover 132 constituting the rear cover unit 119.

The positioning and temporarily fixing of the top plate 136 to the top FPC 135 are performed as follows. Positioning protrusions 139a and 139b provided on the top plate 136 are lightly force-fitted into positioning holes 140a and 140b provided in the top FPC 135, respectively. In this way, a mounting portion of a release switch 137 and a zoom switch 138 is positioned. At the same time, positioning protrusions 142a and 142b provided on the top plate 136 are lightly force-fitted into positioning holes 143a and 143b provided in the top FPC 135, respectively. In this way, a mounting portion of a power switch 141 is positioned. The positioning of the mounting portion of the release switch 137 and the zoom switch 138, and the positioning of the mounting portion of the power switch 141 can be performed for the top plate 136 without interfering with each other because each mounting portion is connected to each other by a narrow arm of the FPC.

The mounting portion of the HDMI connector 144 of the top FPC 135 is not positioned to the top plate 136. As illustrated in FIG. 6, the HDMI connector 144 is inserted into an HDMI connector holding section of the top cover 132. Then, the HDMI connector 144 is pressed by the top plate 136 from the side of the reinforcing plate 145 attached to the reverse surface of the HDMI connector 144 mounting portion of the top FPC 135, and fixed by a screw 146. Further, in a portion for attaching the HDMI connector 144, an HDMI connector holder 147 is attached to the opposite side of the connector insertion opening. In the HDMI connector holding section of the top plate 136, an HDMI connector opening 148 is formed at a position corresponding to the connector insertion opening.

While the other side of the connector is inserted into the HDMI connector 144, the HDMI connector 144 may receive a force of push, twist, and pull from the other side of the connector. When the mounting portion of the HDMI connector 144 of the top FPC 135 is fixed, if an excessive load is applied to the HDMI connector 144, there is a risk of peeling of soldered portion and destruction of the connector. Therefore, the load applied to the connector needs to be appropriately received. Here, a method for receiving the load of push, twist, and pull force applied to the HDMI connector 144 will be described.

First, the load applied by the pushing force is received by a structure in which the HDMI connector holder 147 bumps into a metal shell 149 of the HDMI connector 144 at the back end of the connector.

Next, the load applied by the twisting force needs a structure which can receive the load in four directions at both the connecter insertion opening and the back portion of the connector. Regarding the connector insertion opening, the load in an upward direction of the camera can be received when the connector bumps into (is in contact with) an upper inside wall, and the load in left, right, and downward directions can be received when the connector bumps into (is in contact with) rib-shaped forms 150 and 151. Regarding the back portion of the connector, the load in upward, left, and right directions of the camera can be received when the connector bumps into (is in contact with) the upper inside wall of the top cover 132 and the rib-shaped forms 150 and 151 in the similar way to the above. In other words, the HDMI connector 144 is in contact with the top cover 132 on the surface opposite to the surface on which the USB/AV combination connector 128 is mounted.

Since the load in the downward direction of the camera is a load in a direction pushing onto the top FPC 135, there is no risk of peeling of soldered portion, so that the load is directly received by the top FPC 135. The reinforcing plate 145 is attached to the mounting portion of the HDMI connector 144 of the top FPC 135, and the bottom surface of the reinforcing plate 145 is supported by the top plate 136 and a rib-shaped form 152 of the HDMI connector holder 147 to receive the load.

Finally, the load applied by the pulling force is received when some of DIP-soldered pins of the metal shell 149 of the HDMI connector 144 bumps into (is in contact with) the rib-shaped forms 150 and 151.

A pattern of the top FPC 135 will be described with reference to FIG. 7. The top FPC 135 is a double-sided flexible printed circuit board. As described above, the release switch 137, the zoom switch 138, the power switch 141, and the HDMI connector 144 are mounted on the top FPC 135 by reflow soldering. The components mounted on the top FPC 135 are connected to a connector 153 for connecting the top FPC 135 to the main board 114 by a wiring pattern. The wiring pattern connecting the HDMI connector 144 and the main board 114 includes an HDMI differential signal pattern 154, and a ground pattern 155 is formed on the reverse surface of the board. In summary, the wiring pattern including the HDMI differential signal 154 is formed on the top surface (first surface) of the top FPC 135, and the ground pattern 155 is formed on the bottom surface (second surface) of the top FPC 135.

An impedance matching needs to be done so that the HDMI differential signal pattern 154 satisfies a differential predetermined impedance specification. Therefore, in the present exemplary embodiment, the differential impedance of the HDMI differential signal pattern 154 is controlled by the shape of the ground pattern 155 on the bottom surface opposing the HDMI differential signal pattern 154. The HDMI differential signal pattern 154 is directly wired from a soldering land on the surface on which signal terminals of the HDMI connector 144 are mounted, and a large part of the HDMI differential signal pattern 154 on the top FPC 135 is wired on this surface (first surface).

Next, a configuration of a portion for attaching the main board 114 and the jack FPC 129 to the battery box unit 116 will be described with reference to FIGS. 8 to 10.

As illustrated in FIG. 9, the battery box unit 116 is attached and fixed to the main chassis 117, and becomes a battery box chassis unit 156. Next, the main board 114 is attached to the battery box chassis unit 156. The main board 114 is positioned when the positioning protrusions 157a and 157b (157b is not illustrated in FIG. 9) formed on the battery box 126 fit into positioning holes 158a and 158b formed in the main board 114. Then, the main board 114 is screw-fixed to the main chassis 117 and the battery box 126 by screws 159a, 159b, and 159c. After the main board 114 is attached to the battery box chassis unit 156, the jack FPC 129 is attached. The jack FPC 129 is screw-fixed to the main chassis 117 using a screw 162 after inserting a part of a reinforcing plate 160 attached to the reverse side of the USB/AV combination connector 128 mounting portion under a hook portion 161 formed on the main chassis 117.

In the same way as the HDMI connector 144, the USB/AV combination connector 128 may receive a force of push, twist, and pull from the other side of the connector while the other side of the connector is inserted into the USB/AV combination connector 128. When the mounting portion of the USB/AV combination connector 128 of the jack FPC 129 is fixed, if an excessive load is applied to the USB/AV combination connector 128, there is a risk of peeling of soldered portion and destruction of the connector. Therefore, the load applied to the connector needs to be appropriately received. Here, a method for receiving the load of push, twist, and pull force applied to the USB/AV combination connector 128 will be described.

First, the load of pushing is received by a structure in which the back end of the USB/AV combination connector 128 bumps into (is in contact with) a rib-shaped form 163 formed on the battery box 126.

Next, regarding the load applied by the twisting force, the load in the downward direction of the camera can be received when the connector bumps into the upper wall of the battery unit of the battery box 126 at both the connecter insertion opening and the back portion of the connector. The load in the left and right directions can be received when the connector bumps into (is in contact with) rib-shaped forms 164 and 165 formed on the battery box 126. Since the load in the upward direction of the camera is a load in a direction pushing the connector onto the jack FPC 129, there is no risk of peeling of soldered portion, so that the load is directly received by the jack FPC 129. In other words, the USB/AV combination connector 128 is in contact with the battery box 126 on the surface opposite to the surface on which the HDMI connector 144 is mounted.

The reinforcing plate 160 is attached to the USB/AV combination connector 128 mounting portion, one end of the top surface of the reinforcing plate 160 is pressed by the hook portion 161 formed on the main chassis 117, and the other end is pressed by the screw 162, so that the load is received.

Finally, the load applied by the pulling force is received when some of DIP-soldered pins of the metal shell 166 of the USB/AV combination connector 128 bumps into the rib-shaped form 164.

A pattern of the jack FPC 129 will be described with reference to FIG. 10. The jack FPC 129 is a double-sided flexible printed circuit board. The connector 167 for connecting the USB/AV combination connector 128 and the main board 114 is mounted on the jack FPC 129 by reflow soldering. A wiring pattern for connecting the USB/AV combination connector 128 and the connector 167 is formed on the top surface (first surface) of the jack FPC 129. The wiring pattern includes a USB differential signal pattern 168, and a ground pattern 169 is formed on the bottom surface (second surface) of the board.

The ground pattern 169 is formed so that the ground pattern 169 covers the bottom surface of the USB differential signal pattern 168. An impedance matching needs to be done so that the USB differential signal pattern 168 satisfies a predetermined differential impedance specification. Therefore, the differential impedance of the USB differential signal pattern 168 is controlled by the shape of the ground pattern 169 formed on the bottom surface. The USB differential signal pattern 168 is directly wired from a soldering land on the surface on which signal terminals of the USB/AV combination connector 128 are mounted, and all of the USB differential signal pattern 168 on the jack FPC 129 is wired on this surface.

When the main board 114 and the jack FPC 129 are attached to the battery box chassis unit 156, and the connector 167 mounted on the jack FPC 129 is connected to the other side of the connector mounted on the main board 114, a structure as illustrated in FIG. 8 appears.

In this state, when the lens barrel unit 112, the strobe unit 113, the main chassis 117, and the liquid crystal unit 118 are attached to the main chassis 117, a main assembly unit 170 as illustrated in FIG. 12 appears. Then, the rear cover unit 119 is attached to the main assembly unit 170. At the same time, a connector mounted on the top FPC 135 extending in an arm shape from the rear cover unit 119 is connected to the other side of the connector mounted on the main board 114 to form a shape as illustrated in FIG. 11.

In this state, the reinforcing plates 145 and 160, which are respectively provided on connector mounting portions of the HDMI connector 144 and the USB/AV combination connector 128, overlap with each other. Then, the insertion opening of the USB/AV combination connector 128 is exposed from an opening provided adjacent to the HDMI connector opening 148 formed on the top cover.

Finally, when the front cover unit 111 is attached, assembly of the camera is completed.

An internal configuration of a portion in which the HDMI connector 144 and the USB/AV combination connector 128 are arranged in a completed state of the camera will be described with reference to FIG. 13.

As illustrated in FIG. 13, the HDMI connector 144 and the USB/AV combination connector 128 are arranged so that their surfaces mounted on the boards face each other. Regarding the loads applied from the other side connectors fitted into each connector, the loads in the directions in which the connectors face each other are received by the reinforcing plates provided on the flexible printed circuit boards on which the connectors are mounted. On the other hand, the loads in the reverse directions are received by the top cover 132 and the battery box 126. In summary, the distance between upper and lower connector mounting portions can be shortened while strength against the loads applied to the connectors is secured with a necessary minimum configuration.

The HDMI connector 144 and the USB/AV combination connector 128 are arranged in the direction perpendicular to the surface direction of the main board 114. In addition, the HDMI connector 144 and the USB/AV combination connector 128 are arranged in a shifted position from the main board 114, so that the projected area of the camera can be reduced. Since the depths of each connector is approximately the same as that of the battery 171, by arranging the connectors in a range of the thickness of the battery 171, the connectors do not affect the thickness of the camera even when the connectors are arranged perpendicular to the main board 114. Since the heights of the HDMI connector 144 and the USB/AV combination connector 128 are higher than the other components mounted on the main board 114, the camera can be thinner than a camera in which each connecter is mounted on the main board 114.

Further, on the flexible printed circuit boards on each of which either the HDMI connector 144 or the USB/AV combination connector 128 is mounted, the differential signal pattern is wired on the surfaces on which one of the connectors is mounted, and the ground pattern for controlling impedance is wired on the reverse surfaces.

The HDMI connector 144 and the USB/AV combination connector 128 are arranged in a space surrounded by the top cover 132 and the battery box 126 so that the ground pattern 155 of the top FPC 135 and the ground pattern 169 of the jack FPC 129 face each other. Therefore, an operation signal pattern of one flexible printed circuit board does not overlap with the ground pattern of the other flexible printed circuit board. Therefore, the operation signals are not affected by the ground pattern of the other flexible printed circuit board, and do not affect the differential impedance of the operation signal of the other flexible printed circuit board.

Even when the signal pattern does not include an operation signal, cross-talk between the signal patterns can be prevented.

In the present exemplary embodiment, the description is based on the assumption that the flexible printed circuit board on which the HDMI connector 144 is mounted and the flexible printed circuit board on which the USB/AV combination connector 128 is mounted are separated from each other. However, when the two flexible printed circuit boards are integrated into one board, the same effect can be obtained. In other words, an integrated flexible printed circuit board is formed in which the top FPC 135 and the jack FPC 129 are integrated. In this case, on a first surface of the integrated flexible printed circuit board, the HDMI connector and the USB/AV combination connector are mounted. On the first surface of the integrated flexible printed circuit board, a signal pattern of the HDMI connector and the USB/AV combination connector is formed. On a second surface of the integrated flexible printed circuit board, a ground pattern is formed. Then, the integrated flexible printed circuit board is bent so that the ground patterns face each other. As a result, the HDMI connector and the USB/AV combination connector overlap with each other and are arranged in a space surrounded by the top cover 132 and the battery box 126.

According to the above-described exemplary embodiment, it is possible to realize downsizing and thinning of an electronic apparatus while a plurality of external connection connectors are mounted, and the exemplary embodiment is effective to improve communication speed with an external apparatus.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2009-023967 filed Feb. 4, 2009, which is hereby incorporated by reference herein in its entirety.

What is claimed is:

1. An electronic apparatus comprising:
an outer cover member;
an internal structure member covered by the outer cover member;
a first external connection connector connectable to an external apparatus;
a first printed circuit board having a first surface on which the first external connection connector is mounted thereon, a signal pattern of the first external connection connector is formed on the first surface, and a second surface that is a reverse surface of the first surface, the second surface having a ground pattern formed thereon;
a second external connection connector connectable to an external apparatus; and
a second printed circuit board having a first surface on which the second external connection connector is mounted thereon, a signal pattern of the second external connection connector is formed on the first surface of the second printed circuit board, and a second surface that is a reverse surface of the first surface of the second printed circuit board, the second surface of the second printed circuit board having a ground pattern formed thereon,
wherein the first external connection connector and the second external connection connector overlap with each other and are arranged in a space surrounded by the outer cover member and the internal structure member so that the second surface of the first printed circuit board and the second surface of the second printed circuit board face each other.

2. The electronic apparatus according to claim 1, wherein a first contact surface of the first external connection connector is in contact with the outer cover member, the first contact surface being opposite to a first overlapping surface overlapping with the second external connection connector, and a second contact surface of the second external connection connector is in contact with the internal structure member, the second contact surface being opposite to a second overlapping surface overlapping with the first external connection connector.

3. The electronic apparatus according to claim 1, further comprising reinforcing plates that are formed where the first external connection connector of the first printed circuit board is mounted and where the second external connection connector of the second printed circuit board is mounted, respectively,
wherein the reinforcing plate of the first printed circuit board and the reinforcing plate of the second printed circuit board overlap with each other, and
wherein the first external connection connector and the second external connection connector are arranged in the space.

4. The electronic apparatus according to claim 1, further comprising:
a circuit board to which the first printed circuit board and the second printed circuit board are separately connected,
wherein the first printed circuit board and the second printed circuit board are separately connected to the circuit board while the second surface of the first printed circuit board and the second surface of the second printed circuit board face each other.

5. The electronic apparatus according to claim 1, wherein the internal structure member forms a battery storage chamber.

6. The electronic apparatus according to claim 1, wherein an operation button is arranged on the outer cover member.

* * * * *